United States Patent [15] 3,673,470
Louvel [45] June 27, 1972

[54] HOUSING FOR TRANSISTORS HAVING UNSOLDERED CONNECTIONS FOR OPERATING AT VERY HIGH FREQUENCIES

[72] Inventor: Guy Louvel, Antony, France

[73] Assignee: Compagnie Industrielle Des Telecommunications cit-Alcatel, Paris, France

[22] Filed: May 27, 1971

[21] Appl. No.: 147,561

[30] Foreign Application Priority Data

May 27, 1970 France ..................7019386

[52] U.S. Cl. ..........317/234 R, 317/234 G, 317/234 H, 317/234 J, 317/234 P, 333/79

[51] Int. Cl. ..........H01l 3/00, H01l 5/00

[58] Field of Search ..........317/234 G, 234 H, 234 J, 234 P; 333/7, 79, 80 T; 174/52

[56] References Cited

UNITED STATES PATENTS 3,336,535 8/1967 Mosher ..........317/234 G
3.402.361 9/1968 Havens ..........317/234 G
3,503,015 3/1970 Coraccio et al. ..........317/234 G
3,521,199 7/1970 Wehner ..........317/234 G
3,594,657 7/1971 Cook ..........317/234 G
3,609,480 9/1971 Gerstner ..........317/234 G
3,484,661 12/1969 Boxer ..........317/234 G

*Primary Examiner*—John W. Huckert
*Assistant Examiner*—Andrew J. James
*Attorney*—Sughrue, Rothwell, Mion, Zinn & Macpeak

[57] ABSTRACT

The device enables a transistor to be removed from a circuit without its connections having to be unsoldered or soldered again, and comprises a middle part bearing the transistor, one of whose electrodes is connected to the ground of the middle part and two lateral flanges fitted with plug sockets for receiving the other two electrodes of the transistor. The middle part and the two flanges can be installed together by means of screws. The two flanges can also be installed without the middle, allowing the invention to be used for making measurements on power amplifiers at frequencies greater than 1 Gc/s.

3 Claims, 4 Drawing Figures

HOUSING FOR TRANSISTORS HAVING UNSOLDERED CONNECTIONS FOR OPERATING AT VERY HIGH FREQUENCIES

BACKGROUND OF THE INVENTION

1. Field of the Invention

The present invention concerns a casing for a transistor operating at very high frequencies.

2. Description of the Prior Art

It is known that very-high-frequency transistors are generally in the form of a chip disposed on a screwthreaded pin serving as a support for the transistor and that there are disposed on the periphery of the chip three electrodes in the form of four arms arranged to form a cross, of which two common to the base or to the emitter are designed to be grounded.

Hitherto, for making a measurement on a transistor in operation, the latter has been disposed in a monobloc casing and the electrodes of the transistor have been fixed or soldered to the terminal connecting members provided on the casing.

The transistors may be employed, for example, as power amplifiers. Since they are fragile at high powers, it is necessary to adapt the input and output impedances by means of reactors. There is thus added a conjugate reactance, which is thereafter evaluated by means of a measuring line.

In order that the measurement may be correct, and in order that the positions of the minima and maxima along the measuring line may be defined with precision, it is necessary for the plane of the short-circuit presented by the transistor to be well-defined. At very high frequencies, even small lengths in the connections introduce phase shifts of the electromagnetic wave. Therefore, if it is desired to measure the impedance presented by the transistor in an ultra-high-frequency circuit, it is necessary to remove it and to connect the terminal connecting members by an intermediate link which is substituted for the transistor. This intermediate link introduces a further cause of error into the evaluation of the impedances which are presented by the transistor and which must be compared with the impedances existing in the absence of the latter.

SUMMARY OF THE INVENTION

The device according to the invention makes it possible to obviate this disadvantage, it being possible therein to measure the characteristic impedance of a transistor in a precise manner without any error in the measurement due to intermediate links.

The invention relates to a casing for a transistor operating at very high frequencies, comprising means for connecting a first electrode of the transistor to the central core of a coaxial tap, a second electrode of the transistor to the central core of another coaxial tap, and a third electrode of the transistor to the grounds of the coaxial taps connected to the ground of the said casing, characterized in that the said casing is composed of a central portion which supports the said transistor and which is enclosed between two end plates adapted to be connected together, the said two end plates being formed with an orifice which receives a coaxial tap whose central core appears on the inside face of the end plate, level with the said orifice, the said core being split in the direction of the length on the inside so as to receive the said first and second electrodes, means being provided to connect the said third electrode to the ground of the said central portion of the said casing.

In accordance with another feature, the said two end plates may be connected together when the said central portion is excluded, the two split cores appearing level with the said orifices then coming into contact in order to permit an electrical connection between the said two cores.

BRIEF DESCRIPTION OF THE DRAWINGS

There will be described in the following with reference to the diagrammatic figures an example of the application of the present invention, which example is referred to purely by way of illustration and has no limiting character. Like elements illustrated in a number of these figures bear like references therein.

DESCRIPTION OF THE PREFERRED EMBODIMENT

Figure 1:
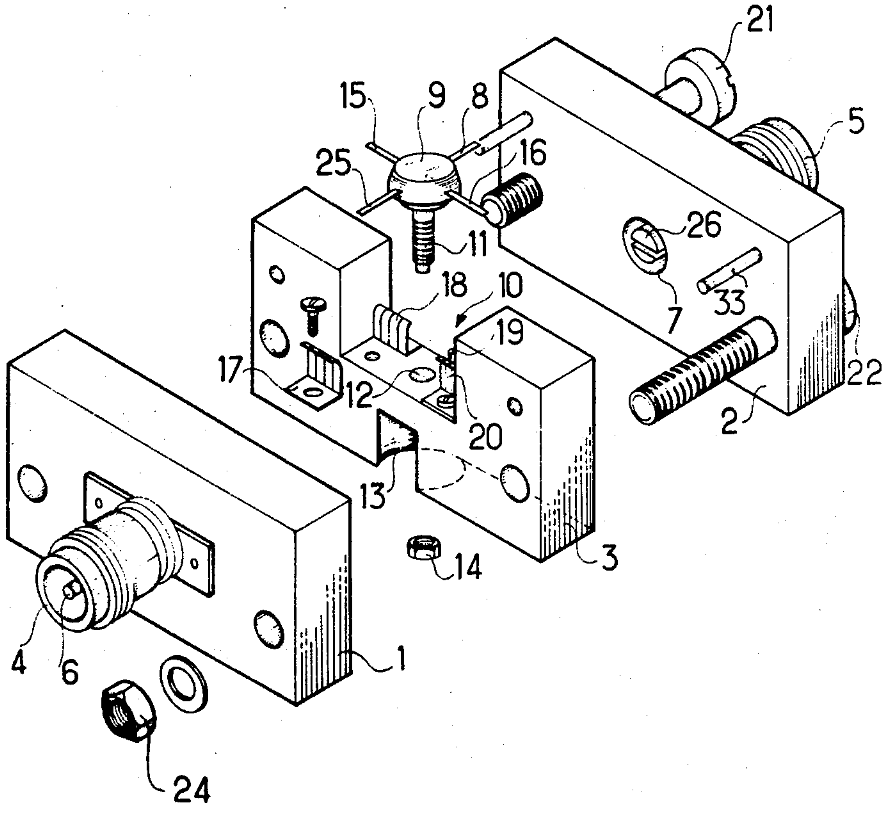
FIG. 1 is a view in perspective of a disassembled casing.

In FIG. 1, there will be seen three parts comprising two end plates 1 and 2 and a central part 3 made of aluminum or the like. The end plates 1 and 2 are identical and have the form of rectangular parallelepipeds. They each support a coaxial tap 4, 5 on one of their larger faces. The central core 6 of the tap appears on the other large face through an orifice 7 in the form of a rod 26 split into two in the direction of its length. This rod 26 projects slightly from the large face of the plate. It makes it possible to receive a flat electrode 8 of a very-high-frequency transistor 9. The transistor 9 is disposed within a U-shaped recess 10 in the parallelepiped forming the central part 3.

For the purpose of attachment, a pin 11 forming part of the transistor 9 can be introduced into an orifice 12 affording communication between the recess 10 and a well 13. A nut 14 is provided in the well 13 to lock the pin 11.

The arms 15 and 16 of the electrode which are at a right angle to the electrode 8 of the transistor must be connected to the mass of the casing. Gripping means 17, 18, 19 and 20 are screwed to the flat base of the recess 10 to receive the arms 15 and 16.

Figure 2:
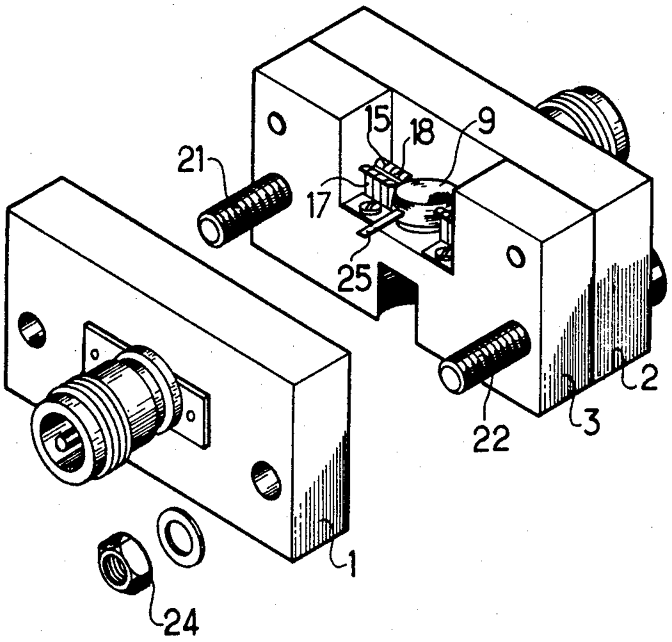
FIG. 2 is a view in perspective of a partly disassembled casing.

The dimensions of the cavity formed by the recess 10 are such that no parasitic modes of the type TM or TE are propagated therein. The cavity can resonate only at frequencies higher than the frequency of use, which is at most a few gigacycles. There will be seen in FIG. 2 the casing partially assembled, with the central plate 3 attached to the end plate 2. The transistor 9 is held fast in its recess, and the gripping means 17, 18, 19 and 20 are secured to their support and hold fast the arms 15 and 16 of the transistor.

Two screws 21 and 22 and guide rods 33 (FIG. 1) are provided for the assembly of the transistor casing.

Figure 3:
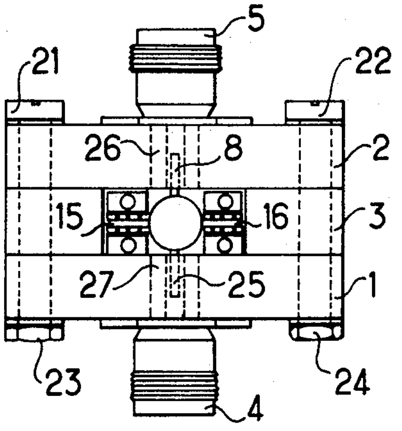
FIG. 3 is a view from above, of the casing, after assembly.

In FIG. 3, the casing composed of the three parts 1, 3 and 2 is completely assembled and the screws 21 and 22 are locked by their nuts 23 and 24.

The electrodes 8 and 25 have been introduced into the rods 26 and 27 of the coaxial taps 4 and 5. The ground connecting means extend through the masses of the end plates 1 and 2 and that of the central part 3 so as to abut the arms 15 and 16 forming the third electrode of the transistor. When an identical measurement is to be made in the absence of the transistor, the casing is taken apart, the central part 3 is withdrawn and only the two end plates 1 and 2 are reassembled, using the same screws 21 and 22. The rods 26 and 27 are then face to face and the electrical contact between the two rods is established by the locking of the assembly.

Figure 4:
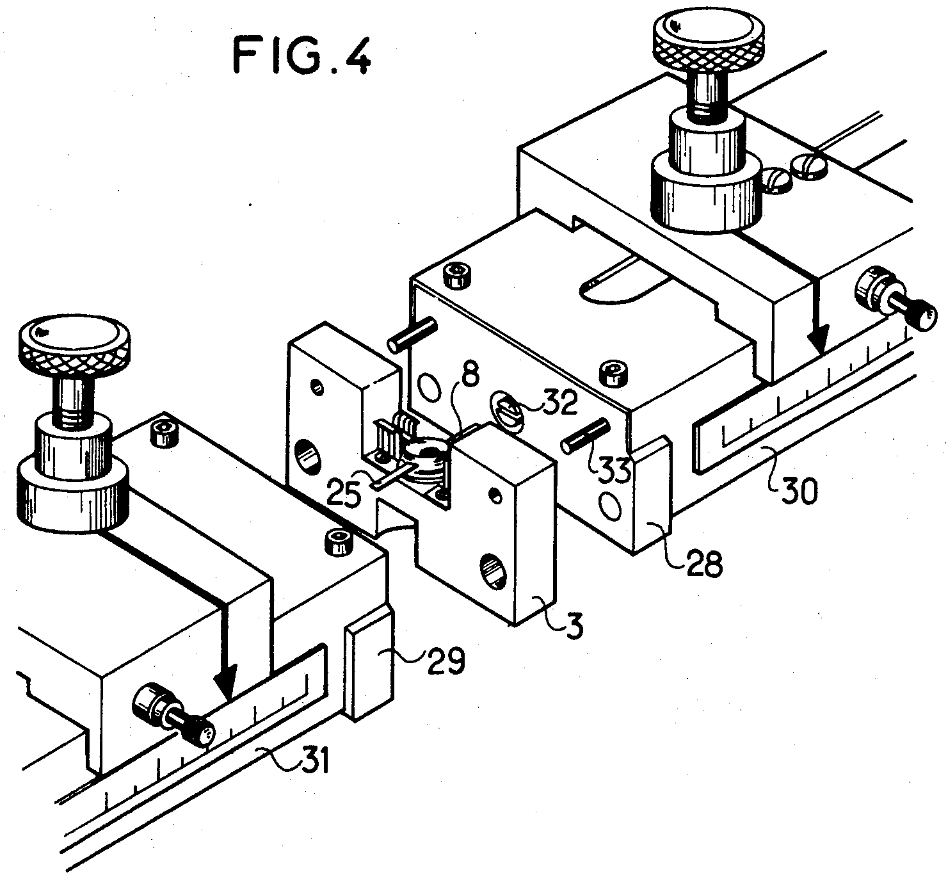
FIG. 4 is an exploded perspective view of the central part of the casing enclosed between two reactors.

In FIG. 4, there will be seen the central portion 3 of the casing secured against end plates 28 and 29 terminating reactors 30 and 31. These end plates have taps in the form of split rods such as 32, as described in applicant's Pat. Application filed under the registration no. 70 13 440, dated April 14, 1970. These taps make it possible to receive the electrodes 8 and 25 of the transistor. This arrangement permits a precise measurement of the impedances due to the reactors. In a subsequent stage, when the central part 3 is removed, it is replaced by the end plate 1 or 2, which establishes the connection of the rod 32 of the reactor to the coaxial tap of the end plate. The coaxial tap permits the connection of a measuring line to determine the impedance presented by the reactor. Thus, the measuring line is connected without any additional transition being established. The measurement is made in the same reference plane as that consisting of the plane comprising the transistor.

Although the device just described appears to be the most advantageous, it will be appreciated that various modifications may be made therein without departing from the scope of the invention, it being possible to replace some of the elements of the device by others capable of performing the same technical function.

The device according to the invention may be employed in all cases where the withdrawal of a transistor must be effected in a practical manner and more particularly when a comparison measurement is to be made in the presence or absence of a transistor.

Particularly interesting applications may be measurements made in the course of the operation of power amplifiers at frequencies above 1 Gc/s.

What is claimed is:

1. In a casing for a transistor operating at very high frequencies including means for connecting a first electrode of the transistor to the central core of a coaxial tap, a second electrode of the transistor to the central core of another coaxial tap, and a third electrode of the transistor to the grounds of the coaxial taps connected to the ground of the said casing, the improvement wherein: said casing is composed of a central portion which supports said transistor and two end plates adapted to be connected together and which is enclosed therebetween, said two end plates being formed with an orifice, a coaxial tap whose central core appears on the inside face of the end plate received within said orifice and level with the said orifice, said core being split in the direction of its length on the inside so as to receive said first and second electrodes and means connecting said third electrode to the ground of the said central portion of the said casing.

2. The casing according to claim 1, including means allowing said two end plates to be connected together when the said central part is excluded, with said two split cores being level with the orifices then coming into contact so as to permit an electrical connection between the said two cores.

3. The casing according to claim 1, wherein: said means connecting said third electrode to said ground comprise a plurality of gripping means adapted to receive the arms of the said third electrode with said gripping means being secured to one of the walls of a U-shaped cavity within the said central part with said cavity containing said transistor.

* * * * *